United States Patent
Den et al.

(10) Patent No.: US 6,717,777 B2
(45) Date of Patent: Apr. 6, 2004

(54) MAGNETIC DEVICE WITH POROUS LAYER AND METHOD FOR MANUFACTURING THE SAME, AND SOLID MAGNETIC MEMORY

(75) Inventors: Tohru Den, Tokyo (JP); Nobuhiro Yasui, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 114 days.

(21) Appl. No.: 09/947,499

(22) Filed: Sep. 7, 2001

(65) Prior Publication Data

US 2002/0031008 A1 Mar. 14, 2002

(30) Foreign Application Priority Data

Sep. 8, 2000 (JP) ........................................ 2000/273948

(51) Int. Cl.$^7$ ............................................... G11B 5/39
(52) U.S. Cl. ..................................................... 360/324
(58) Field of Search ................................. 360/324, 131, 360/126; 365/158; 428/457, 692; 257/761

(56) References Cited

U.S. PATENT DOCUMENTS

| | | | | |
|---|---|---|---|---|
| 5,764,567 | A | | 6/1998 | Parkin .......................... 365/173 |
| 5,812,350 | A | * | 9/1998 | Chen et al. .................. 360/126 |
| 6,055,179 | A | * | 4/2000 | Koganei et al. ............. 365/158 |
| 6,139,713 | A | | 10/2000 | Masuda et al. .............. 205/206 |
| 6,172,902 | B1 | * | 1/2001 | Wegrowe et al. ........... 365/158 |
| 6,172,903 | B1 | * | 1/2001 | Nishimura .................. 365/158 |
| 6,256,222 | B1 | * | 7/2001 | Sakakima et al. .......... 365/158 |
| 2002/0034662 | A1 | * | 3/2002 | Den .............................. 428/692 |
| 2002/0058148 | A1 | * | 5/2002 | Den .............................. 428/457 |
| 2003/0001274 | A1 | * | 1/2003 | Den et al. ..................... 257/761 |

FOREIGN PATENT DOCUMENTS

| | | |
|---|---|---|
| JP | 10-121292 | 5/1998 |
| JP | 10-283618 | 10/1998 |
| JP | 11-224422 | 8/1999 |

OTHER PUBLICATIONS

Furneaux et al., The formation of controlled-porosity . . . aluminum, Nature, vol. 337, No. 6203, 147–149 (1989).

Masuda H., Solid State Physics, vol. 31, No. 5, 493–499 (1996).

Masuda et al., "Fabrication of Gold Nanodot Array . . . Mask", Jpn. J. Appl. Phys. vol. 35, Pt. 2, No. 1B, L126–L129 (1996).

S. Dubois wt al., "Perpendicular giant magnetoresistance . . . nanowires", Appl. Phys. Lett., vol. 70, No. 3, 396–398 (1997).

Katine et al., "Current-induced realignment . . . pillars", Appl. Phys. Lett., vol. 76, No. 3, 354–356 (2000).

* cited by examiner

*Primary Examiner*—Tianjie Chen
(74) *Attorney, Agent, or Firm*—Fitzpatrick, Cella, Harper & Scinto

(57) ABSTRACT

The present invention provides a magnetic device to be used by flowing an electric current in the direction of depth of pores comprising a porous layer on a substrate, ferromagnetic layers and a non-magnetic layer being laminated within all or a part of pores, a first ferromagnetic layer, and a second ferromagnetic layer having a smaller coercive force than the first ferromagnetic layer, the first ferromagnetic layer being laminated on the second ferromagnetic layer by being separated with the non-magnetic layer, wherein the first ferromagnetic layer contains the same elements as in the second ferromagnetic layer, the proportion of each element being different between the two ferromagnetic layers.

10 Claims, 6 Drawing Sheets

STATE A

STATE B

STATE C

STATE D

MAGNETIC DEVICE WITH POROUS LAYER AND METHOD FOR MANUFACTURING THE SAME, AND SOLID MAGNETIC MEMORY

BACKGROUND OF THE INVENTION

1. Field of the Invention

The magnetic memory according to the present invention is applicable in wide technical fields such as a magnetic memory, magnetic sensor and spin electronic device. The present invention particularly provides a useful device as a part of the solid magnetic memory device.

2. Description of the Related Art

A DRAM, SRAM, flash memory, EEPROM and FeRAM have been used as the memory device in recent years. However, the solid magnetic memories, in particular memories taking advantage of TMR and GMR effects, have became great matters of interest from the view point of non-volatility, high speed and high density of memories, and studies of them are in progress. The magnetic memory closely related to the present invention will be described hereinafter.

The giant magnetoresistance (GMR) will be described at first. GMR was discovered by Fert and Grunberg in 1986 to 1988. They found that a gigantic magnetoresistance larger than AMR is observed in a ferromagnetic (Fe)/non-magnetic (Cr) artificial lattice, and they named this phenomenon as the giant magnetoresistance (GMR). This GMR has a negative magnetoresistivity change against an applied magnetic field with a magnetoresistivity change of as large as several scores of percentages. The cause of GMR is qualitatively elucidated as follows. When no magnetic field is applied, magnetic layers in the artificial lattice are aligned in an antiferromagnetic relation with each other (interlayer antiferromagnetism). When a magnetic field is applied to these layers, magnetization of each layer is aligned to be parallel with each other. Then, electric resistance is decreased by the magnetic field under a spin-dependent mechanism by which conduction electrons having antiparallel spins to the direction of magnetization are strongly scattered while the electrons having parallel spins to the direction of magnetization of magnetization are weakly scattered. The antiparallel relation of magnetization between the layers have been theoretically studied based on RKKY type long distance exchange interaction and quantum well model, and spin dependent scattering between the layers has been discussed by a theory based on a two liquid model of the conduction electrons.

For utilizing this GMR effect in memory devices, for example, the direction of magnetization of a part of the ferromagnetic layers is fixed, and the direction of magnetization of the remaining ferromagnetic layers are changed to permit the ferromagnetic layers to serve as a memory. The devise so constructed as described above is named as a spin-valve type thin film magnetic element. The layer in which the direction of magnetization remains unchanged (or a layer having a high coercive force) is named as a pinned or hard (ferromagnetic) layer, and the layer in which the direction of magnetization varies (or a layer having a low coercive force) is named as a free (ferromagnetic) layer. In a different method, on the contrary, a line of magnetic information is recorded on the hard layer and magnetization states (memory states) are read from magnetoresistivity changes caused by reversing magnetization of the free ferromagnetic layer.

The types of GMR known in the art include a CIP type, a CPP type, a CAP type as a mixed type of the CIP and CPP types, and a granular alloy type. Generally speaking, the CIP structure has been most frequently studied because of its easiness in manufacturing. However, the magnetoresistivity change is about 40 to 50% in the CIP type GMR in which an electric current flows parallel to the lamination face, due to contributions of the conduction electrons that are not involved in spin scattering at the interface. In the CPP type GMR in which the electric current vertically flows against the lamination face, on the other hand, the magnetoresistivity change often exceeds 100% since all the electrons experience spin scattering at the interface of the lamination layers depending on their spin states, and due to increased Fermi velocity ascribed to an energy gap arising from the lamination structure. Therefore, the CPP type is superior in basic characteristics to the other type.

However, since the electric current vertically flows against film faces in the CPP type, the magnetoresistance of the film tends to be small. Consequently, micropores involved in the laminated structure should have a quite fine cross sectional area.

An examples of the structure that is not a simple lamination structure of the ferromagnetic layer/non-magnetic layer formed in the micropore of the CPP type GMR device is described in Applied Physics Letters, Vol. 70, 396 (1997). This report describes a structure in which a three layer structure of NiFe alloy/Cu/NiFe alloy is inserted between two thick Cu layers, and an effect for decreasing a saturation magnetic field is expressed by the action of this layered structure. However, no memory effect is manifested in this example.

An example of expression of the memory effect is described in Applied Physics Letters, Vol. 76, 354 (2000). In this paper, a laminated structure is formed by inserting a thick ferromagnetic layer (a hard ferromagnetic layer 15) and a thin ferromagnetic layer (a free ferromagnetic layer 14) are inserted between the two non-magnetic layers 16 as shown in FIG. 6A, thereby succeeding in obtaining a memory effect comprising about 10% of magnetoresistivity changes. However, inversion of the memory states is not clearly shown.

Conventionally available memory cell utilizing a tunnel junction is disclosed in U.S. Pat. No. 5,764,567. Such cell usually has a laminated structure comprising an antiferromagnetic layer 63, a pinned layer 61, a non-magnetic layer 62 (an insulation layer) and a free ferromagnetic layer 14 as shown in FIG. 6B. The direction of magnetization in the ferromagnetic layer is usually in the longitudinal axis of the cell. The tunnel electric current particularly increases when the two ferromagnetic layers separated with the insulation layer have the same direction of magnetization with each other, resulting in a small electric resistance of the cell. When the two ferromagnetic layers separated with the insulation layer have different directions of magnetization with each other, on the contrary, the tunnel electric current is reduced to consequently increase the electric resistance of the cell. As shown in FIG. 6B, the direction of magnetization of the ferromagnetic layer is usually fixed in the ferromagnetic layer (pinned layer 61) as one of the two ferromagnetic layers, and the direction of magnetization of the other ferromagnetic layer (free ferromagnetic layer 14) is made to be variable. The direction of magnetization of this free ferromagnetic layer 14 is controlled by the magnetic field generated by the electric current flowing in write lines disposed on and under the cell. In other words, signals are written on only selected cell portions by a vector sum of the magnetic field from the upper and lower wiring lines. The signal is read by upper and lower read lines formed in the cell. Cell is selected using a MOSFET.

While a larger magnetoresistivity change is arithmetically possible, the corresponding value of the practically available device is in the range of 40 to 60%. The method for manufacturing the insulation layer and bias dependency of the magnetoresistivity change are the most crucial problems in manufacturing the device and on the characteristics of the device. An insulation layer with a uniform thickness of about 1 nm required for the device is difficult to manufacture. Moreover, it is an problem that the magnetoresistivity change is largely decreased when the voltage is increased due to bias dependency. These problems have not been encountered in the GMR device.

Since the CPP type GMR structure is used in the present invention, micropores having a large aspect ratio are required. For obtaining such structure, a membrane filter manufactured by a track etching method or an anodic oxidation alumina are used. The most preferable anodic oxidation alumina will be described in detail hereinafter.

An anodic oxidation alumina layer as a porous anodic oxidation film is formed by anodic oxidation of an Al plate in an acidic electrolyte solution such as a solution of sulfuric acid, oxalic acid and phosphoric acid[see for example R. C. Furneaux, W. R. Rigby and A. P. Davidson, NATURE Vol. 337, p147 (1989)]. The porous film has a peculiar geometric structure in which cylindrical micropores (nano-holes) as fine as several nanometers to several hundreds of nanometers in their diameter are arranged in parallel with spaces of several scores of nanometers to several hundreds of nanometers among them. These cylindrical micropores have a high aspect ratio as well as uniform cross sectional diameter.

The structure of the porous film may be altered to a certain extent by changing the conditions of anodic oxidation. For example, the interval between the micropores, the depth of the micropores and the diameter of the micropores are controllable by changing the anodic oxidation voltage, by controlling the anodic oxidation time and by applying a pore-widening treatment, respectively, in a certain extent. The pore-widening treatment as used herein refers to an etching treatment of alumna that is usually applied by wet etching using phosphoric acid.

A method for improving vertical orientation, linearity and isolation of the porous film by applying two step anodic oxidation, or a method for forming the porous film comprising micropores with better vertical orientation, linearity and isolation by repeatedly applying anodic oxidation after once removing the porous film formed by applying anodic oxidation, have been proposed (Japanese Journal of Applied Physics, Vol. 35, Part 2, pp. L126–L129, Jan., 15, 1996). This method takes advantage of the facts that depressions on the Al plate formed by removing the anodic oxidation film formed by the first anodic oxidation function as initiation points for forming the micropore in the second anodic oxidation.

Another method for forming the porous film having the micropores with improved shapes, spaces and patterns has been proposed [for example, Japanese Patent Laid-open No. 10-121292, or Masuda, Kotai Butsuri (Solid State Physics) 31, 493 (1996)], wherein a stamper is used for forming the micropore initiation points, or anodic oxidation is applied after forming the depressions, generated by pressing a substrate comprising a plurality of projections on the surface onto the surface of the Al plate, as the micropore initiation points. In a different art reported, the micropores form a concentric circle instead of forming a honeycomb structure (for example, Japanese Patent laid-open No. 11-224422).

Japanese Patent Laid-open No. 10-283618 discloses an art in which a laminated magnetic film having GMR characteristics is embedded in the nano-hole formed by anodic oxidation. Although this patent publication describes an art in which the hard ferromagnetic layer and free ferromagnetic layer are formed by composition differences between the layers, the magnetoresistivity change is about 10% while manifesting an insufficient memory effect.

The conventional GMR device as hitherto described is a CIP type device, and has an insufficient magnetoresistivity change of about 40%. Stability and uniformity of the CCP type GMR device was also insufficient.

SUMMARY OF THE INVENTION

Accordingly, it is an object of the present invention for solving the problems in the related art to provide a high density magnetic device and a method for readily manufacturing the magnetic device, and to provide a solid magnetic memory comprising the magnetic device, wherein the CPP type GMR device comprises a hard layer excellent in stability in a cell having a large aspect ratio, and a laminated structure by which initial states of magnetization of the hard layer and free ferromagnetic layer can be easily generated with good stability.

The present invention for attaining the foregoing objects provides a magnetic device to be used by flowing an electric current in the direction of depth of pores. The magnetic device comprises a porous layer on a substrate, a first ferromagnetic layer, and a second ferromagnetic layer having a smaller coercive force than the first ferromagnetic layer. The ferromagnetic layers and a non-magnetic layer are laminated within all or a part of pores. The first ferromagnetic layer is laminated on the second ferromagnetic layer by being separated with the non-magnetic layer. The first ferromagnetic layer contains the same elements as in the second ferromagnetic layer, and the proportion of each element is different between the two ferromagnetic layers.

The present invention also provides a method for manufacturing the magnetic device, wherein the hard ferromagnetic layers comprising the same elements with different proportions between the layers, and the free ferromagnetic magnetic layer are formed by electrodeposition in the same electrolyte solution by changing electrodeposition potentials among the steps for electrodepositing the hard ferromagnetic layers and free ferromagnetic layer.

Preferably, the non-magnetic layer mainly comprises Cu, and the ferromagnetic layers mainly comprise Co or a FeNi alloy. The magnetic device is preferably formed by laminating ten cycles or more of one unit comprising a laminated layer of (hard ferromagnetic layer/non-magnetic layer/free ferromagnetic layer/non-magnetic layer) in which the hard ferromagnetic layer and free ferromagnetic layer are laminated by being separated with the non-magnetic layer in order to secure a sufficient magnetoresistance.

Preferably, the magnetic device comprises a micro-porous layer comprising alumina nano-holes formed by anodic oxidation. Preferably, an underlayer mainly comprising Cu is formed at the bottom of the micro-porous layer, and the plural micropores are arranged in a honeycomb shape or rectangular shape.

Further objects, featured and advantages of the present invention will become apparent from the following descriptions of the preferred embodiments with reference to the attached drawings.

DESCRIPTION OF THE PREFERRED EMBODIMENTS

Figure 1A:
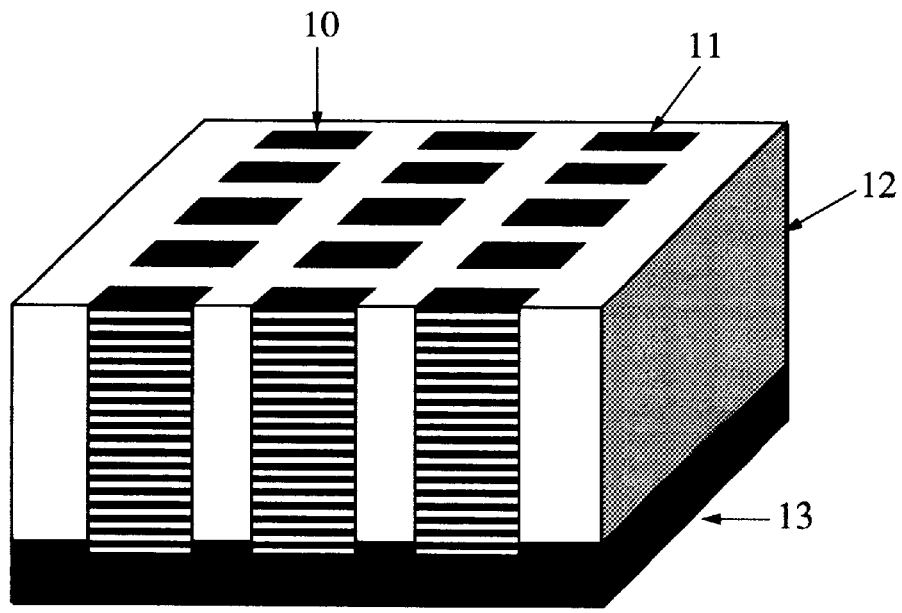
FIG. 1A is a perspective view of the magnetic device for illustrating one embodiment of the present invention.
Figure 1B:
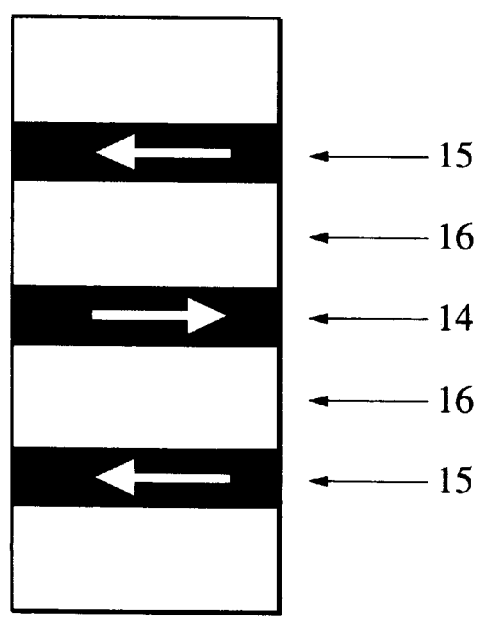
FIG. 1B is a schematic partial cross section showing an example of the laminated magnetic material of the magnetic device shown in FIG. 1B.

The function of the present invention will be described hereinafter with reference to FIGS. 1A, 1B and 3. FIG. 1A is a perspective view of the magnetic device, and FIG. 1B is a partial cross section thereof. FIG. 3 shows variable magnetization states of a part of the laminated layer of the ferromagnetic material/nonmagnetic material, wherein the arrow in FIG. 3 denotes the direction of magnetization in each ferromagnetic layer. In these drawings, the reference numeral 10 denotes a laminated magnetic material, the reference numeral 11 denotes micropores, the reference numeral 12 denotes micropore layers, the reference numeral 13 denotes an underlayer, the reference numeral 14 denotes a free ferromagnetic layer, the reference numeral 15 denotes hard ferromagnetic layers, and the reference numeral 16 denotes non-magnetic layers. Wiring lines are omitted in FIG. 1A.

The hard ferromagnetic layers 15 and the free ferromagnetic layer 14 comprises the same elements but have different composition ratios of, for example, Co/Cu with each other. The proportion of Co in the hard ferromagnetic layers 15 may exceeds 90% while the proportion of Co in the free ferromagnetic layer 14 may be about 70%.

When a sufficiently large magnetic field is applied in the right direction to the magnetic device shown in FIG. 1B and FIG. 3 for determining an initial magnetization state, the directions of magnetization in all the ferromagnetic layers are aligned in the direction of the applied magnetic field (the magnetic state A in FIG. 3). Since magnetization of each ferromagnetic layer is aligned in the same direction in this magnetic state, the GMR element is put in a low magnetoresistance state. When a magnetic field is then applied in the left direction in the drawing, magnetization of the free ferromagnetic layer 14 having a small coercive force is reversed in the direction of the applied magnetic field (the magnetic state B in FIG. 3). Magnetoresistance is increased in this magnetic state since the direction of magnetization of the hard ferromagnetic layers 15 adjoining to each free ferromagnetic layer 14 by being separated with a non-magnetic layer 16, and the direction of magnetization of the free ferromagnetic layer 14 are aligned in inverse directions with each other. When the applied magnetic field is further increased in the left direction, all the ferromagnetic layers are magnetized in the left direction (the magnetic state C in FIG. 3) to put the magnetic device in a low magnetoresistance state again. Then, a magnetic field is applied in the right direction to inverse only the direction of magnetization of the free ferromagnetic layer 14 having a small coercive force to the right direction, thereby putting the magnetic device in a high magnetoresistance state (the magnetic state D in FIG. 3). When a magnetic field in the right direction is again applied during the magnetic state B, the magnetic device returns to the magnetic state A since only magnetization of the free ferromagnetic layer 14 is reversed in the right direction.

A memory function is given during such magnetization process by allowing, for example, the magnetic states A and B, or magnetization state C and D, to correspond to 0 and 1, respectively, of the memory. Alternatively, a memory function is given by allowing, for example, the magnetic states A and B, and magnetization state C and D, to correspond to 0 and 1, respectively, of the memory, and by switching the magnetization states by applying a relatively large magnetic field. Since the magnetization state of the hard ferromagnetic layer 15 is read by reading a magnetoresistivity change through inversion of only the free ferromagnetic layer 14 in the latter example, the method is useful for constructing a memory device having a high S/N ratio.

The manufacturing method according to the present invention will be described below. Electrodeposition is carried out in an electrodeposition solution in which Co ions and Cu ions are dissolved together in this example. When the working electrode potential (electrodeposition voltage) is gradually increased toward the negative direction from the potential of an counter-electrode, or a reference electrode, Cu having a smaller electrolytic potential is electrodeposited at first, and Co having a larger electrolytic potential also starts to deposit by further increasing the potential of the working electrode. When the proportion of Co ions in the solution is adjusted to be significantly higher than the proportion of Cu ions, only Cu can be electrodeposited at a specified voltage while allowing Co dissolved in a high concentration in the solution to deposit at a sufficiently large electrolytic potential. This means that a laminated film comprising a Cu layer as a non-magnetic layer and a ferromagnetic layer containing Co as a principal component together with Cu may be obtained by properly selecting the electrodeposition potential and electrodeposition time. The composition ratio of Co/Cu may be also changed by changing the electrodeposition potential for depositing the ferromagnetic layer, thereby permitting a ferromagnetic layer having different coercive force to be manufactured. This function turns put to be more effective when two or more kinds of ferromagnetic ions exist together.

While any materials are available as ferromagnetic materials according to the present invention so long as they are conductive ferromagnetic materials, materials having high spin polarizability and being easy to control their composition are preferable. Examples of these materials include ion group alloys comprising Co, Fe and Ni, or alloys containing these elements as principal components with a balance of elements contained in the non-magnetic layer. While a thickness of sub-nanometers to several scores of nanometers is allowable for each ferromagnetic layer, a thickness of 1 to 5 nm is preferable from the view point of the magnetoresistivity change.

Figure 2A:
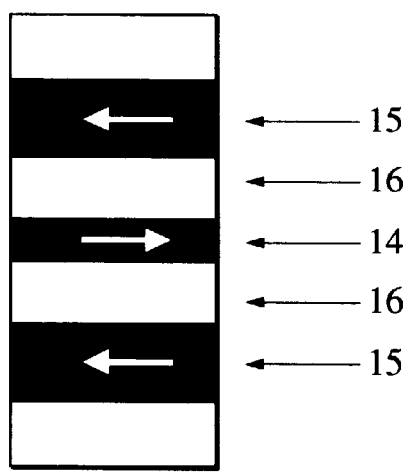
FIG. 2A is a schematic partial cross section showing another example of the laminated magnetic material according to the present invention.

These ferromagnetic layers are laminated so that the hard ferromagnetic layer having a high coercive force and the free ferromagnetic layer having a low coercive force are separated with a thick non-magnetic layer as shown in FIG. 1B. The phrase "high" or "low" coercive force as used herein refers to relative levels of the coercive force in comparison with respective ferromagnetic layers. Practically, it is preferable that the hard ferromagnetic layer has a coercive force in the range of 10 Oe to 1 KOe, and the free ferromagnetic layer has a coercive force in the range of 1 to 100 Oe. The hard ferromagnetic layer cannot be sufficiently distinguished from the free ferromagnetic layer only by allowing the thickness of each layer to be different with each other. In addition, making the composition of the hard ferromagnetic layer to be quite different from the composition of the free ferromagnetic layer is not advantageous for manufacturing a CPP structure with many laminated layers and high aspect ratio. Accordingly, the hard ferromagnetic layer is distinguished from the free ferromagnetic layer by changing the proportion of the constitution elements between them in the present invention, while the hard ferromagnetic layer and free ferromagnetic layer comprise the same kind of elements with each other. It is of course effective to improve the characteristics of the magnetic device by adjusting the thickness of the hard ferromagnetic layer 15 to be different from the thickness of the free ferromagnetic layer 14 as shown in FIG. 2A. In other words, the hard ferromagnetic layer 15 comprises a high coercive force composition ratio as compared with the free ferromagnetic layer 14 in addition to being thicker than the free ferromagnetic layer.

While any materials are available for the non-magnetic layer so long as they are conductive non-magnetic materials, pure metals such as Cu, Ag, Cr and Au, or alloys containing these metals as principal components are preferable. Although a thickness of sub-nanometers to several scores of nanometers is allowable for the non-magnetic layer, it is preferably in the range of several nanometers to several scores of nanometers in order to allow the interaction between the free ferromagnetic layer and hard ferromagnetic layer not to be so strong.

Practically used compositions will be described hereinafter with respect to the examples in which Cu is used for the non-magnetic layer by taking the above descriptions into consideration. Characteristics as the ferromagnetic material is largely affected by the content of Cu in Co, when the ferromagnetic layer mainly comprise Co. This means that a layer functions as the hard ferromagnetic layer when the content of Cu in Co is low, since the coercive force as well as saturation magnetization are increased. When the content of Cu is increased, on the other hand, the layer functions as the free ferromagnetic layer. The characteristics of the ferromagnetic layer can be controlled by the ratios among the three components of Fe—Ni—Co, when the ferromagnetic layer mainly comprises a FeNi alloy. When the content of Fe is increased while decreasing the content of Cu in the hard ferromagnetic layer, it is effective for the free ferromagnetic layer to increase the contents of Ni and Cu as compared with the hard ferromagnetic layer.

While the magnetic device according to the present invention comprises a construction in which a laminated magnetic material is embedded in the micropores as hitherto described, one and half unit of the laminated structure is illustrated in the examples of the laminated bodies shown in FIG. 1B, FIG. 2A and FIG. 3. In other words, a plurality of units are repeatedly laminated in a part of or from the bottom to the top of the micropores. Accordingly, the actual cycles of the laminated layers are determined by the length of the micropore and the length of one unit. It is preferable in the present invention that 10 cycles (or 40 cycles as a lamination of the ferromagnetic layers and non-magnetic layers) to several hundreds cycles of one unit are coupled so that the magnetoresistance is large enough for obtaining sufficient signals.

It is essential for sufficiently sensing output signals in the magnetic device according to the present invention that the laminated structure as described above is formed in the micropore. The diameter of the micropore is preferably in the range of several nanometers to several hundreds of nanometers, and the aspect ratio of the micropore is preferably 5 or more. While various cross sectional shapes such as circular, ellipsoidal and rectangular are allowable, the micropores are preferably formed to have a uniform cross section. When the cross section of the micropore is rectangular, the direction of magnetization in each ferromagnetic layer is preferably in the longitudinal axis direction of the rectangle, and a rotating magnetization may be utilized when the cross section is circular.

While conventional semiconductor lithography and EB lithography are available for forming the micropores, they can be quite effectively formed by anodic oxidation of aluminum as a method for controllably forming the micropores with a large aspect ratio. The diameter of the micropore may be controlled in the order of about 10 to several hundreds of nanometers by anodic oxidation of aluminum, and the space between the two micropores may be also controlled in the range of from a distance a little larger than the diameter of the micropore to about 500 nm. While various acids may be used for anodic oxidation of aluminum, a sulfuric acid bath is preferably used for forming the micropore with fine spaces, a phosphoric acid bath is preferably used for forming the micropores with relatively large spaces, and an oxalic acid bath is preferably used for forming the micropores with intermediate spaces. The diameter of the micropore can be enlarged by etching with a phosphoric acid solution after anodic oxidation.

Figure 4A:
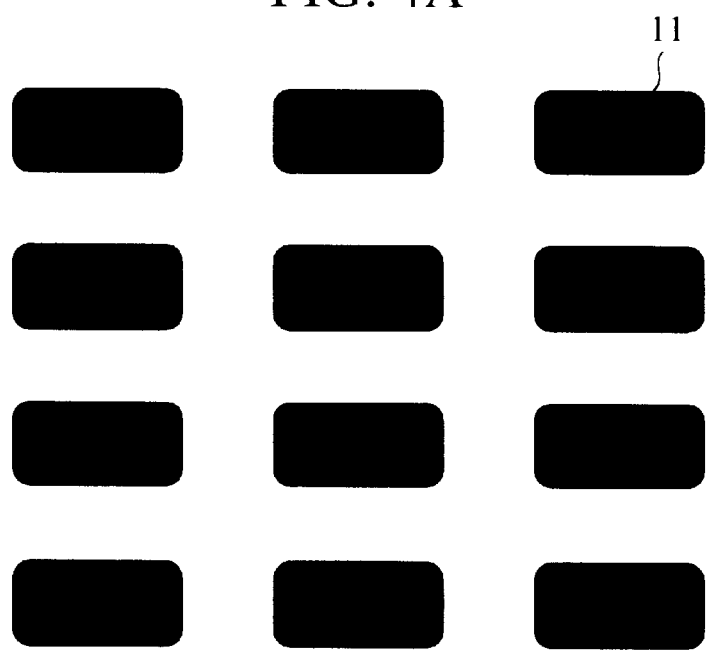
FIG. 4A illustrates an example of arrangement of micropores—a rectangular arrangement—in the magnetic device according to the present invention.
Figure 4B:
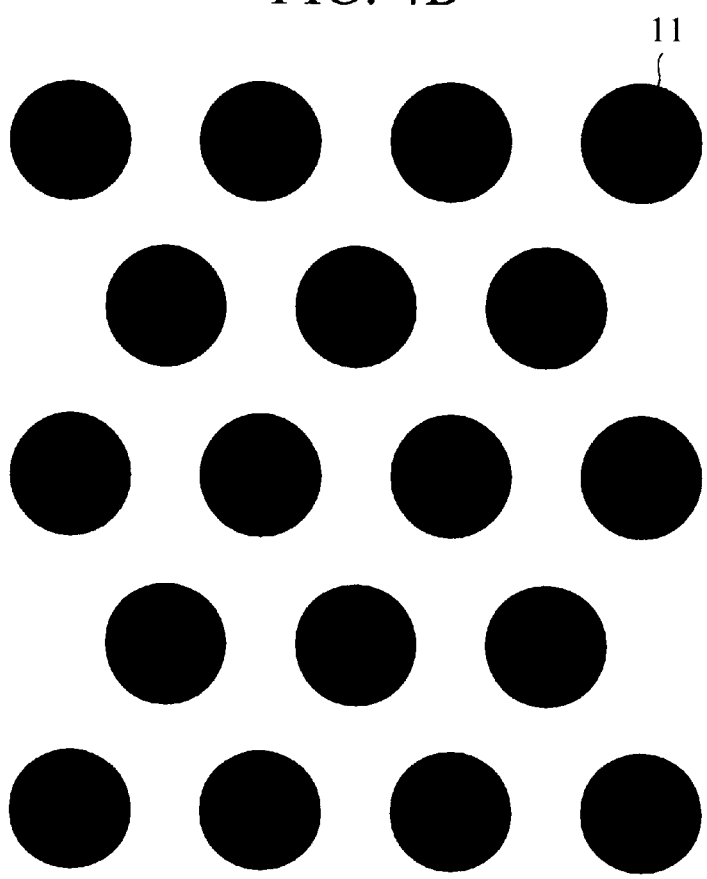
FIG. 4B shows another example of arrangement of micropores—a honeycomb arrangement—in the magnetic device according to the present invention.

A method for previously forming depressions that serve as starting points of the micropores as hitherto described, or a method using two step anodic oxidation is effective for regularly forming the micropores. A rectangular arrangement and a honeycomb arrangement as shown in FIGS. 4A and 4B, or a square arrangement as a special case thereof, are preferable for arranging the micropores to be used in the present invention. However, although such regular arrangement is necessary for wiring individual micropores, a random arrangement may be used for wiring plural micropores together.

While various metals are available for the underlayer metal of the nano-hole of aluminum formed by oxidation, the underlayer metal is preferably Cu when the laminated film is formed in the micropores by electrodeposition from the point of controllable electrodeposition.

While Al is usually used as the layer to be subjected to anodic oxidation, other elements may be contained provided that the film mainly comprises aluminum and is capable of applying anodic oxidation. For example, a vacuum vapor deposition method by resistance heating, a sputtering method or a CVD method may be used for depositing Al. However, it is not preferable that the method cannot form a considerably smooth surface.

While vacuum vapor deposition and sputtering are available for embedding the ferromagnetic material and non-magnetic material in the micropore, the electrodeposition method is preferable for embedding into the micropore having a large aspect ratio. It is effective for forming the laminated film by electrodeposition that a pulse deposition method is used in a solution containing ions having different electrolytic potentials with each other. Preferably, a laminated film of Cu and Co, and a laminated film of Cu and a NiFe alloy may be used as the materials advantageous for electrodeposition.

An example of the manufacturing method is described with reference to FIGS. 2A and 2B. Electrodeposition with a mixed electrolyte solution of cobalt sulfate and copper sulfate will be described in this example. The concentration of the Co ion is several hundreds times as large as that of the Cu ion. It is also effective to add boric acid for adjusting pH and a lubricant in the electrodeposition solution other than the ions described above. A substrate that serves as a working electrode, and a counter-electrode and reference electrode are provided in this solution. While the reference electrode is not needed when the electrodeposition solution and the surface of the counter-electrode are stable, it is preferable to use the reference electrode when the counter-electrode is unstable or resistance of the electrodeposition solution is high.

Figure 2B:
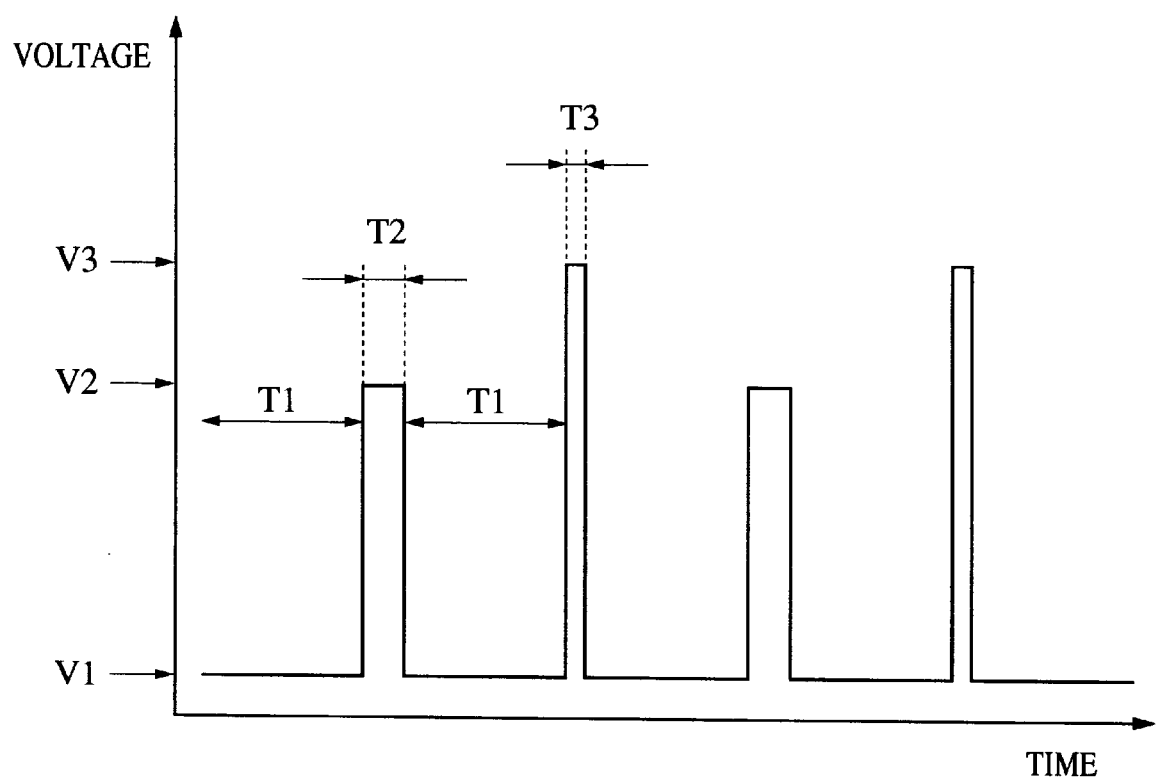
FIG. 2B is a graph showing electrodeposition voltage for forming the laminated magnetic material shown in FIG. 2A.
Figure 3A:
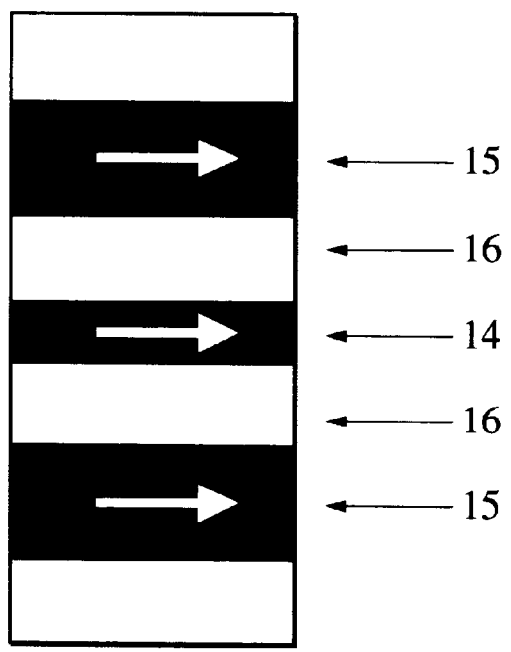
FIG. 3 is an illustrative drawing showing varying magnetization states (states A to D) of the laminated material according to the present invention.
Figure 3B:
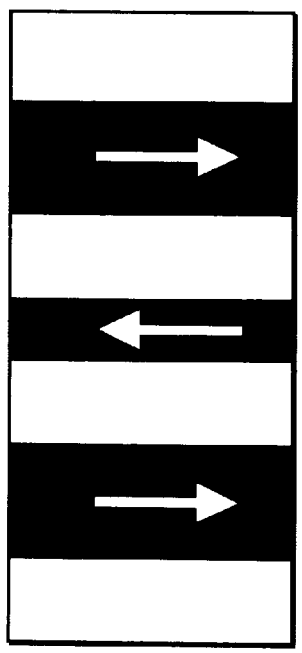
Figure 3C:
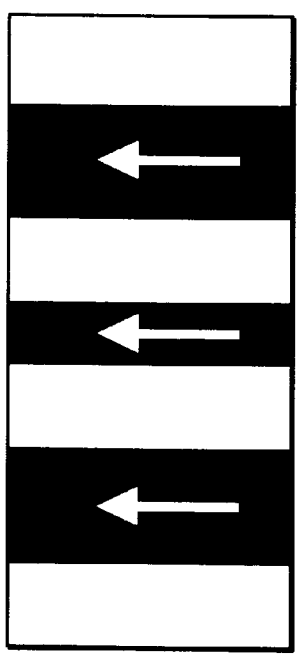
Figure 3D:
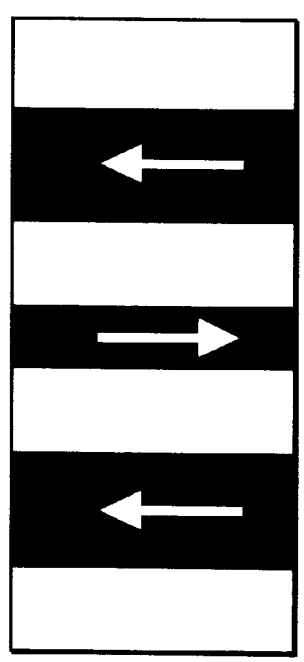

A voltage pattern shown in FIG. 2B is then applied to the working electrode. FIG. 2B is a graph showing the electrodeposition voltage for forming the laminated magnetic material by electrodeposition as a function of time. The horizontal axis denotes the time, and the vertical axis denotes the voltage of the working electrode relative to the reference electrode, and the graph is expressed by placing negative direction upward. Although only Cu is electrodeposited at an initial voltage V1, deposition of Cu takes a relatively long time for attaining a desired thickness, because the applied voltage and the concentration of Cu in the electrodeposition solution are small. When the voltage is increased to V2, Co dissolved in a high concentration is mainly electrodeposited together with a certain quantity of Cu, thereby depositing the free ferromagnetic layer. The electrodeposition time may be short since the cobalt ion concentration as well as the voltage are large. Subsequently, the voltage is reduced to V1 to deposit Cu as the non-magnetic layer, followed by increasing the voltage at V3. While a film mainly comprising Co is deposited as in the step applying the voltage V2, the content of Cu is reduced as the voltage V3 is larger than V2. The hard ferromagnetic layer is formed in this deposition step. The electrodeposition time may be further shortened since the electrodeposition voltage V3 is larger than V2. A laminated magnetic material of a CCP type GMR element having a large aspect ratio is thus manufactured by repeating four times of the electrodeposition steps as described above.

A higher degree of composition distribution can be obtained by the electrodeposition method as described above when the electrodeposition solution contains two or more kinds of magnetic ions. For example, the characteristics of the ferromagnetic layer may be controlled by changing the proportion between Ni and Fe when Ni and Fe are used in place of Co. Since Ni having a smaller electrolytic potential is more readily deposited, the Fe content should be increased by increasing the electrolytic potential for forming the hard ferromagnetic layer.

The magnetic device according to the present invention is quite advantageous when it is used as a part of the solid magnetic memory. However, the device is applicable for a magnetic sensor as well as a magnetic switching device and signal sensing member of a magnetic computing device. When the magnetic device according to the present invention is used for the magnetic sensor, at least two wiring lines are necessary at the bottom and top of the micropore. Read lines are also required in addition to the write lines when the magnetic device is used for the memory.

EXAMPLES the present invention will be described hereinafter in more detail with reference to examples.

Example 1 and Comparative Example 1

The construction as shown in FIG. 2A was obtained in the micropore in this example by electrodeposition and lamination under the voltage conditions shown in FIG. 2B using a micropore layer comprising anodic oxidation alumina nano-holes. In FIGS. 2A and 2B, the reference numeral 14 denote the free ferromagnetic layer, the reference numeral 15 denotes the hard ferromagnetic layer, the reference numeral 16 denotes the non-magnetic layer, T1 denotes a time interval when an electrodeposition voltage V1 is applied, T2 denotes a time interval when an electrodeposition voltage V2 is applied, and T3 denotes a time interval when an electrodeposition voltage V3 is applied.

FIGS. 5A to 5E are schematic cross sections for illustrating the process according to the present invention, wherein the reference numeral 51 denotes a substrate, the reference numeral 13 denotes an underlayer, the reference numeral 52 denotes an Al film, the reference numeral 53 denotes alumina nano-holes, the reference numeral 54 denotes an anodic oxidation alumina layer, the reference numeral 10 denotes a laminated magnetic material, the reference numeral 55 denotes a surface insulation layer, and the reference numeral 56 denotes an upper electrode.

Figure 5A:
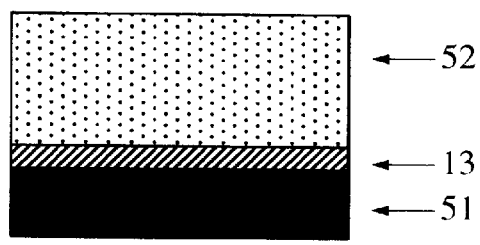
FIG. 5A shows a first step for manufacturing the magnetic device in the example.
Figure 5B:
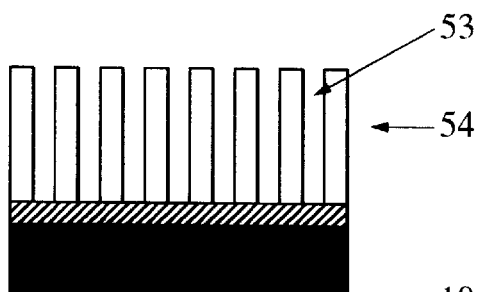
FIG. 5B shows a second step for manufacturing the magnetic device in the example.

Ti and Cu are first deposited at a thickness of 5 nm and 10 nm, respectively, on the Si substrate 51 by sputtering, and the Al film 52 was deposited and laminated thereon at a thickness of 1 µm by sputtering, thereby forming the construction as shown in FIG. 5A. After setting the substrate on a holder so that the portions other than the surface of Al are protected from contacting the solution, the substrate was subjected to anodic oxidation from the Al surface in an oxalic acid solution with a concentration of 0.3 mole/litter (0.3 M) and held at 16° C. under a constant voltage of 40V. The anodic oxidation process was completed when anodic oxidation of Al came to its end and the anodic oxidation current had decreased, and a pore-widening treatment was applied thereafter for 30 minutes in a phosphoric acid solution with a concentration of 5% by mass. The Al film 52 was converted into an anodic oxidation alumina nano-hole film having micropores (alumina nano-holes 53) with a diameter of about 50 nm as shown in FIG. 5B. The bottom of the micropore was a little enlarged, and the micropores were penetrated through the Cu underlayer 13.

Then, the substrate on which the anodic oxidation alumina nano-holes film were formed was immersed in an electrolyte solution comprising 0.5M of cobalt sulfate and 0.001M of copper sulfate together with a platinum counter-electrode, and the laminated magnetic material was electrodeposited until the electrodeposition products overflow on the micropore using the following electrodeposition conditions as one cycle with reference to an Ag—AgCl reference electrode (the electrodeposition condition in the each example below corresponds to a layer formed in one cycle). The conditions below corresponds to V1=−0.56V, T1=30 seconds, V2=−1.0V, T2=0.1 second, V3=−1.4 V and T3=0.15 seconds in FIG. 2B. About 140 cycles of electrodeposition were necessary before the electrodeposition product overflows the upper part of the micropore. The composition ratio as described herein was obtained by a EPMA assay when the films were deposited under the same conditions, and the coercive fore was measured using the same sample.

Example 1

[Electrodeposition Conditions]

−0.56V (30 seconds)/−1.0V (0.1 second)/−0.56V (30 seconds)/−1.4V (0.15 second)

[Layer Construction]

non-magnetic layer 16 (about 3 nm)/free ferromagnetic layer 14 (about 1 nm, Co:Cu=8:2, coercive force 180 Oe)/non-magnetic layer 16 (about 3 nm)/hard ferromagnetic layer 15 (about 2 nm, Co:Cu=9:1, coercive force=300 Oe)

Comparative Example 1

[Electrodeposition Conditions]

−0.56V (14 seconds)/−1.2V (0.1 second)

[Layer Construction]

non-magnetic layer (about 1.2 nm)/ferromagnetic layer (about 1 nm, Co:Cu=8.5:1.5, coercive force=230 Oe)

Figure 5C:
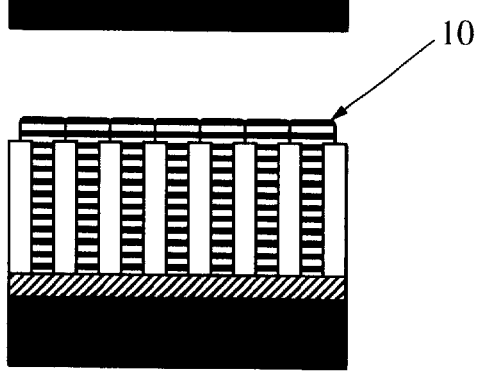
FIG. 5C shows a third step for manufacturing the magnetic device in the example.

As a result, the laminated magnetic material 10 as shown in FIG. 5C was formed in and over the alumina nano-hole 53. The laminated magnetic material in Example 1 had a structure as shown in FIG. 2A. The layer formed by depositing only Cu at an applied voltage of −0.56V serves as the non-magnetic layer 16, the layer formed by mainly depositing Co from a high concentration solution of Co at an applied voltage of −1.4V serves as the hard ferromagnetic layer 15, and the layer formed by mainly depositing Co from a high concentration solution of Co at an applied voltage of −1.0V serves as the thin free ferromagnetic layer 14 since the layer contains more Cu than the hard ferromagnetic layer.

Figure 5D:
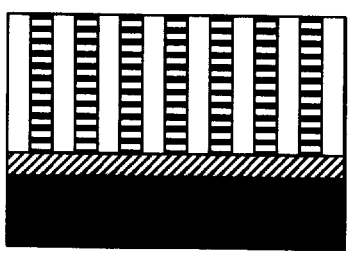
FIG. 5D shows a fourth step for manufacturing the magnetic device in the example.
Figure 5E:
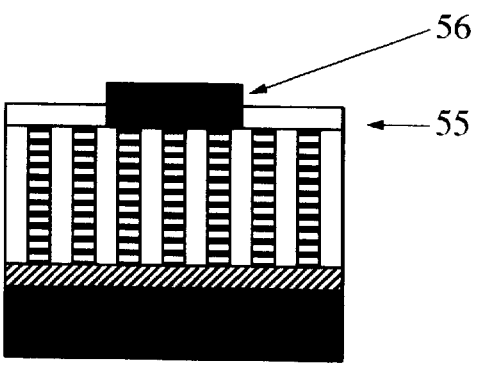
FIG. 5E shows a fifth step for manufacturing the magnetic device in the example.
Figure 6A:
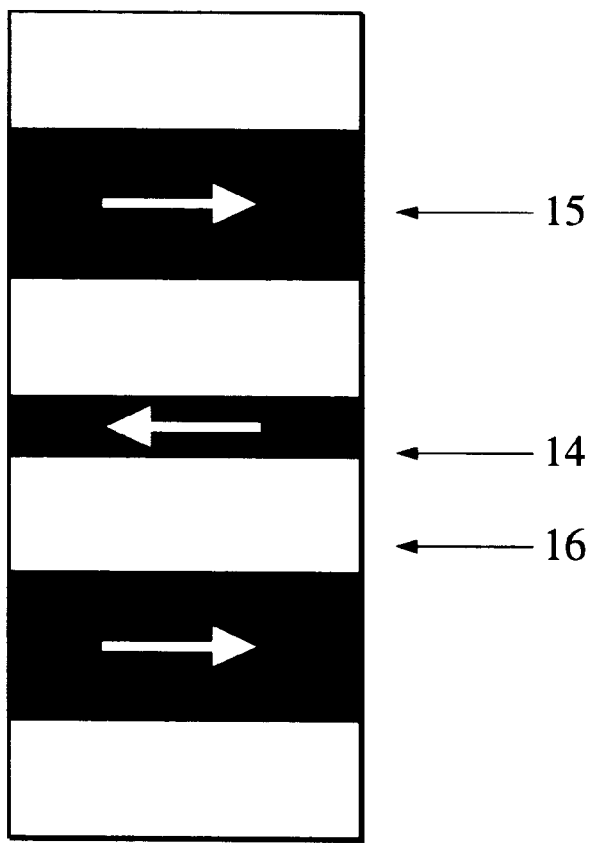
FIG. 6A is a schematic partial cross section showing an example of the laminated magnetic material of the conventional GMR (TMR) type magnetic device.
Figure 6B:
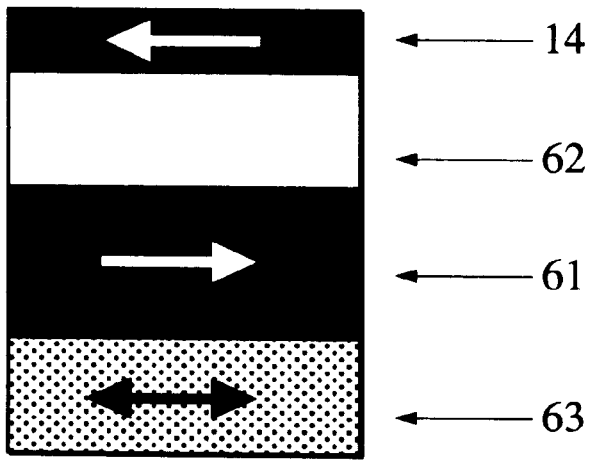
FIG. 6B is a schematic partial cross section showing another example of the laminated magnetic material of the conventional GMR (TMR) type magnetic device

The laminated magnetic film exposed over the alumina nano-hole 53 was removed by surface polishing to obtain a laminated body as shown in FIG. 5D. Silicon dioxide as the surface insulation film 55 was deposited thereon at a thickness of 50 nm and, after removing a part of the insulation film, Cu as the upper electrode 56 was deposited at a thickness of 50 nm on the portion where the insulation film had been removed, thereby obtaining the structure shown in FIG. 5E.

The magnetic devices manufactured in Example 1 and Comparative Example 1 were evaluated with respect to the magnetoresistivity change in a magnetic field. Although the magnetoresistivity change at a high magnetic field was larger in Comparative Example 1, the magnetoresistivity change at a low magnetic field was twice or more as large as in Example 1, showing that the magnetic device in Example 1 has improved memory characteristics and low working magnetic field while being excellent in uniformity of operation. These characteristics were practically evaluated by setting an initial state by returning the applied magnetic field to zero Oe after applying a sufficiently large magnetic field of 8 KOe in the right direction in the drawing, gradually increasing the magnetic field in the left direction to an intensity where the direction of magnetization of the free ferromagnetic layer is supposed to be reversed to the left direction, and gradually increasing the applied magnetic field in the right direction to an intensity where the direction of magnetization of the free ferromagnetic layer is supposed to be reversed to the right direction. The memory characteristics means steepness of the magnetoresistivity change observed by sweeping the magnetic field, and uniformity of operation is evaluated by the degree of characteristic changes when only magnetization of the free ferromagnetic layer is repeatedly reversed.

Example 2

The NiFe alloy was used in the ferromagnetic material in place of Co in this example. The same procedures as in Example were used except the electrodeposition steps. An electrolyte solution comprising 0.5M of ion sulfate, 0.5M of nickel sulfate and 0.001M copper sulfate was used. The laminated magnetic material was immersed in the electrolyte solution above together with the platinum counter-electrode using the Ag—AgCl reference electrode, and was electrodeposited with about 140 cycles until the electrodeposition product overflows over the micropore, wherein the following conditions were used as one cycle.

[Electrodeposition Conditions]

−0.56V (30 seconds)/−1.3V (0.1 second)/−0.56V (30 seconds)/−1.8V (0.15 second)

[Layer Construction]

non-magnetic layer 16 (about 3 nm)/free ferromagnetic layer 14 (about 1 nm, Fe:Ni:Cu=3:5:2, coercive force 20 Oe)/non-magnetic layer 16 (about 3 nm)/hard ferromagnetic layer 15 (about 2 nm, Fe:Ni:Cu=5:4:1, coercive force=140 Oe)

As a result, a laminated magnetic material was formed in the alumina nano-hole, wherein the hard ferromagnetic layer as shown in FIG. 2A was slightly thicker than the free ferromagnetic layer in this example, and the hard ferromagnetic layer and free ferromagnetic layer were separated with the non-magnetic layer with each other. The surface insulation layer and upper electrode were formed after polishing the surface of the laminated magnetic material by the same method as in Example 1 to evaluate the magnetic device. The result showed that, as in Example 1, the magnetic device has a large magnetoresistivity change at a low magnetic field while being excellent in memory characteristics, low working magnetic field and uniformity of operation. The magnetic device according to this example was superior to the magnetic device in Example 1 in low working magnetic field and uniformity of operation, although the magnetoresistivity change is slightly low.

Example 3

The micropores were arranged in a honeycomb shape and rectangular shape in this example. The device was manufactured by the same method as in Example 1. However, the initiation points were drawn by a FIB method after depositing the Al film shown in FIG. 5A. The initiation points were formed with a depth of about 50 nm by irradiating a converged ion-beam as dots on the surface of the Al film, wherein the converged ion-beam comprises a Ga ion-beam with a diameter of 30 nm, an ion current of 10 pA and an acceleration voltage of 30 KV.

The space between the adjacent initiation points was 100 nm in the honeycomb arrangement, while the shorter space and the longer space were 80 nm and 120 nm, respectively, in the rectangular arrangement. Anodic oxidation was carried out under a voltage of 40V in a 0.3M oxalic acid solution. Circular micropores were obtained in the honeycomb arrangement and rectangular micropores with a little rounded corners were obtained in the rectangular arrangement, by applying a pore-widening treatment in a 5% phosphoric acid solution for 30 minutes. The magnetic device was manufactured by electrodepositing the laminated magnetic material of Co/Cu in the micropore by the same method as in Example 1, and was evaluated after forming wiring lines.

The magnetic device was evaluated by the same method as in the foregoing examples. The same characteristics as in Example 1 were obtained in the magnetic device having the honeycomb arrangement, and local uniformity of the characteristics was also improved. This may be elucidated as a result of improved uniformity of configurations such as the diameter and linearity of the micropore. Lowering of the working magnetic field and a slight improvement in the magnetoresistivity change in addition to local uniformity were observed in the magnetic device with the rectangular arrangement. This may be elucidated as a result of an effect for lowering demagnetization magnetic field in the direction of magnetization in each ferromagnetic layer due to an anisotropic configuration of the rectangular shape and an effect for stabilizing magnetization, in addition to uniformity of the configuration.

Example 4

Micropores other than the anodic oxidation alumina micropores were formed in this example. A Ti and Cu film were deposited at a thickness of 5 nm and 50 nm, respectively, by sputtering as underlayers on the Si substrate 51, and a $SiO_2$ film 52 was deposited by sputtering at a thickness of 500 nm to obtain the structure shown in FIG. 5A. Then, rectangular holes with a dimension of 200 nm×100 nm were drawn by the FIB method with a space of 500 nm after depositing a Cr film as a mask with a thickness of 100 nm by sputtering, thereby drilling rectangular holes on the Cr film onto the surface of the $SiO_2$ film 52. Subsequently, rectangular holes with the same shape as the mask were formed on the $SiO_2$ film by dry-etching in a $CF_4$ atmosphere. A laminated magnetic material was manufactured by the same method as in Example 1 for evaluation, obtaining a sufficient magnetoresistivity change in the magnetic field, memory characteristics, low working magnetic field and uniformity of operation, although the magnetoresistance was low.

When the laminate layers were manufactured by sputtering in place of electrodeposition, the characteristics were poor as compared with the magnetic device manufactured by electrodeposition, although sufficient characteristics were obtained. This is probably because lamination at near the bottom of the micropore was not uniform in the device manufactured by the sputtering method, as compared with the device manufactured by the electrodeposition method.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structured and functions.

What is claimed is:

1. A magnetic device to be used by passing an electric current in the direction of depth of pores comprising:

a porous layer on a substrate; and a first ferromagnetic layer, a second ferromagnetic layer and a non-magnetic layer being laminated within all or a part of pores;

wherein the second ferromagnetic layer has a smaller coercive force than the first ferromagnetic layer, the first ferromagnetic layer being laminated on the second ferromagnetic layer by being separated with the non-magnetic layer, wherein the first ferromagnetic layer contains the same elements as in the second ferromagnetic layer, the proportion of each element being different between the two ferromagnetic layers, and wherein a surface shape of the pores having the layers is a rectangle.

2. A magnetic device according to claim 1, wherein the ferromagnetic layers contain Co, and the non-magnetic layer contains Cu.

3. A magnetic device according to claim 1, wherein the ferromagnetic layers contain a FeNi alloy, and the non-magnetic layer contains Cu.

4. A magnetic device according to claim 1 comprising ten cycles or more of a laminated unit formed by laminating the first and second ferromagnetic layers by being separated with the non-magnetic layer.

5. A magnetic device according to claim 1, wherein the porous layer comprises alumina having nano-size pores.

6. A magnetic device according to claim 5 further comprising a conductive layer between the porous layer and substrate.

7. A magnetic layer according to claim 5, wherein the plural pores are arranged in a rectangular array.

8. A memory comprising the magnetic device according to claim 1.

9. A method for manufacturing the magnetic device according to claim 1, comprising the steps of:

providing a substrate having a porous layer on at least one face of the substrate;

electrodepositing the first ferromagnetic layer in the pore; and electrodepositing the second ferromagnetic layer in the pore by changing potential in the same solution as used for electrodeposition of the first ferromagnetic layer.

10. A magnetic device according to claim 1, wherein a corner of the rectangle is round.

* * * * *